(12) United States Patent
Johnson et al.

(10) Patent No.: US 8,729,609 B2
(45) Date of Patent: May 20, 2014

(54) INTEGRATED CIRCUITS INCLUDING MULTI-GATE TRANSISTORS LOCALLY INTERCONNECTED BY CONTINUOUS FIN STRUCTURE AND METHODS FOR THE FABRICATION THEREOF

(75) Inventors: Frank Scott Johnson, Wappingers Falls, NY (US); Andreas Knorr, Wappingers Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 383 days.

(21) Appl. No.: 12/711,022

(22) Filed: Feb. 23, 2010

(65) Prior Publication Data

US 2011/0204419 A1    Aug. 25, 2011

(51) Int. Cl.
*H01L 29/66* (2006.01)
(52) U.S. Cl.
USPC ........... 257/264; 257/347; 257/354; 257/204; 257/E23.141

(58) Field of Classification Search
USPC ............ 257/204, E27.046, E21.532; 438/129
See application file for complete search history.

(56) References Cited

U.S. PATENT DOCUMENTS

| 2004/0110331 A1* | 6/2004 | Yeo et al. | 438/199 |
| 2007/0077743 A1* | 4/2007 | Rao et al. | 438/595 |
| 2009/0209074 A1* | 8/2009 | Anderson et al. | 438/283 |

* cited by examiner

*Primary Examiner* — Elias M Ullah
(74) *Attorney, Agent, or Firm* — Ingrassia Fisher & Lorenz, P.C.

(57) ABSTRACT

Embodiments of an integrated circuit are provided. In one embodiment, the integrated circuit includes a substrate and a plurality of locally interconnected multi-gate transistors. The plurality of locally interconnected multi-gate transistors includes a continuous fin structure formed on the substrate and first and second multi-gate transistors formed on the substrate and including first and second fin segments of the continuous fin structure, respectively. The continuous fin structure electrically interconnects the first and second multi-gate transistors.

10 Claims, 11 Drawing Sheets

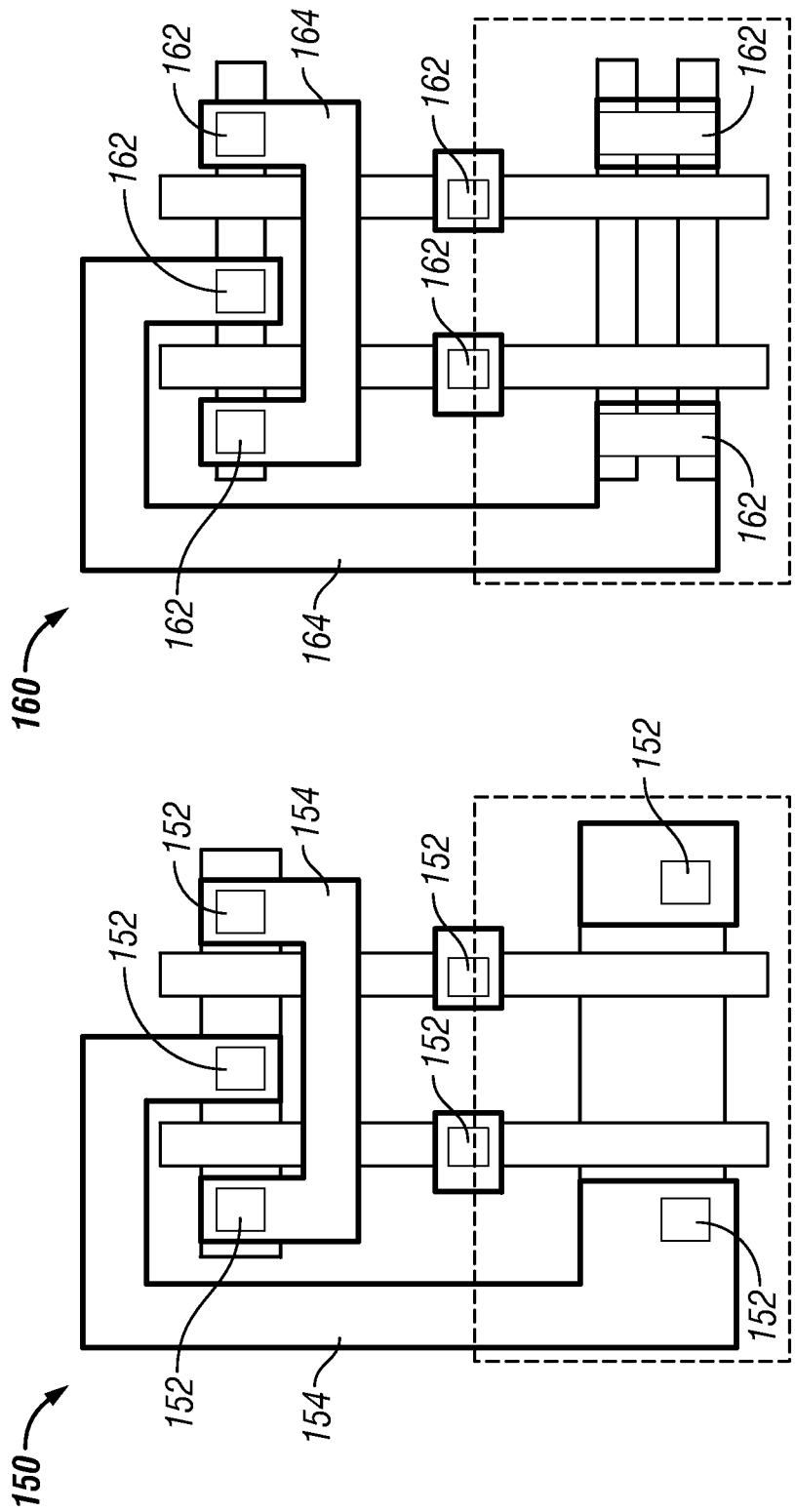

INTEGRATED CIRCUITS INCLUDING MULTI-GATE TRANSISTORS LOCALLY INTERCONNECTED BY CONTINUOUS FIN STRUCTURE AND METHODS FOR THE FABRICATION THEREOF

TECHNICAL FIELD

The present invention relates generally to semiconductor devices and, more particularly, to integrated circuits and methods for fabricating integrated circuits including multi-gate transistors locally interconnected by a continuous fin structure.

BACKGROUND

In contrast to conventional planar metal-oxide-semiconductor field-effect-transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved. One known type of multi-gate, non-planar transistor, commonly referred to as a "FinFET," includes one or more parallel fin structures (the "fins") formed on a substrate, such as a silicon-on-insulator substrate. The fins extend along a first axis between common source and drain electrodes. At least one conductive gate structure (the "gate") is formed over the fins and extends along a second axis generally perpendicular to the first axis. More specifically, the gate extends across and over the fins such that an intermediate portion of the gate conformally overlays three surfaces of each fin (i.e., an upper surface, a first sidewall surface, and a second opposing sidewall surface of each fin).

It is generally advantageous to locally interconnect semiconductor devices, when possible, to minimize circuit dimensions and to reduce the complexity and possibly the number of back-end-of-the-line layers required to complete the desired integrated circuit. It has, however, proven difficult to design circuits incorporating FinFETs (or other multi-gate semiconductor devices, such as triFETs) having a desired degree of local interconnectivity while satisfying current scaling targets, which have been significantly reduced and continue to be reduced in accordance with industry demands. In the context of multi-gate devices and high density scaling targets, circuit rules tend to severely restrict or entirely eliminate local interconnect techniques conventionally utilized in conjunction with lower density MOSFET circuits. For example, polysilicon gate routing, active area routing, deposited metal routing, and similar conventional local interconnect techniques are each associated with various drawbacks that render such techniques unsuitable or undesirable for employment in high density circuits that include interconnected FinFETs or other multi-gate semiconductor devices.

In view of the above, there exists an ongoing need to provide embodiments of an integrated circuit including multiple multi-gate semiconductor devices locally interconnected in a manner that is compatible with small scale circuit rules. It would also be desirable to provide embodiments of a fabrication method suitable for producing such an integrated circuit. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of an integrated circuit are provided. In one embodiment, the integrated circuit includes a substrate and a plurality of locally interconnected non-planar transistors. The plurality of locally interconnected non-planar transistors includes a continuous fin structure formed on the substrate and first and second non-planar transistors formed on the substrate and including first and second fin segments of the continuous fin structure, respectively. The continuous fin structure electrically interconnects the first and second non-planar transistors.

Embodiments of a method for fabricating an integrated circuit are further provided. In one embodiment, the method includes the steps of providing a substrate; forming a continuous fin structure on the substrate; depositing a first gate structure overlying a first portion of the continuous fin structure to form, at least in part, a first multi-gate transistor; and depositing a second gate structure overlying a second portion of the continuous fin structure to form, at least in part, a second multi-gate transistor. The second multi-gate transistor is electrically interconnected to the first multi-gate transistor by the continuous fin structure.

BRIEF DESCRIPTION OF THE DRAWINGS

The present invention will hereinafter be described in conjunction with the following drawing figures, wherein like numerals denote like elements, and wherein:

FIGS. 15 and 16 are top plan views of a two input NOR gate implemented utilizing planar transistors and non-planar transistors, respectively, in accordance with the teachings of prior art;

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description.

The following describes two exemplary embodiments of an integrated circuit including a plurality of multi-gate semiconductor devices locally interconnected by one or more continuous fin structures. The exemplary integrated circuits described below can be fabricated utilizing various combinations and sequences of steps conventionally known within the semiconductor industry. However, to provide an instructive context for the subsequent description of the exemplary integrated circuits, an exemplary manner in which a plurality of FinFETs can be fabricated on a semiconductor substrate is first described below in conjunction with FIGS. 1-8. The conventional FinFET fabrication process described below in conjunction with FIGS. 1-8 is provided by way of example only and is not intended to be limiting or exhaustive; various steps in the manufacture of multi-gate semiconductor devices are well-known and, in the interests of brevity, will only be mentioned briefly herein or will be omitted entirely without providing the well-known process details.

Figure 1:
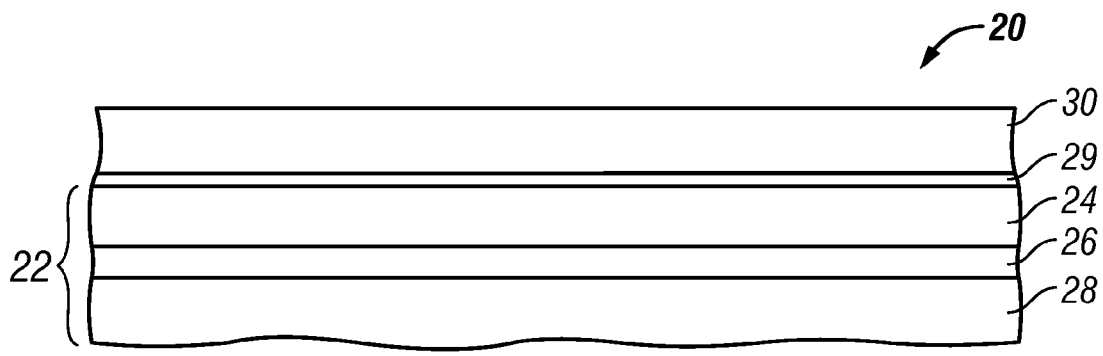
FIGS. 1-8 are simplified cross-sectional and top views illustrating various steps included within an exemplary method for producing a partially-completed semiconductor device including a plurality of FinFETs in accordance with the teachings of prior art.

Referring initially to FIG. 1, an exemplary method of fabrication suitable producing an integrated circuit 20 including a plurality of FinFETs commences with the provision of a semiconductor substrate 22. As appearing herein, the term "semiconductor substrate" encompasses the relatively pure silicon materials typically employed in the semiconductor industry, as well as silicon admixed with other elements, such as germanium, carbon, and the like. Semiconductor substrate 22 can be a bulk silicon wafer. However, as indicated in FIG. 1, semiconductor substrate 22 preferably assumes the form of a silicon-on-insulator (SOI) wafer including an upper silicon layer 24 overlying an intermediate insulating layer 26 (also commonly referred to as a "buried oxide" or "BOX" layer), which is supported by a silicon carrier wafer 28. A mandrel-forming layer 30 is deposited over upper silicon layer 24 of semiconductor substrate 22 utilizing a known deposition technique, such as chemical vapor deposition. Mandrel-forming layer 30 can comprise various types of materials including, for example, polycrystalline silicon, silicon oxynitride, silicon oxide, silicon nitride, and the like. If desired, one or more intervening layers (e.g., a hard mask layer) can be formed between mandrel-forming layer 30 and upper silicon layer 24 of semiconductor substrate 22; for example, a silicon nitride layer 29 may be formed between mandrel-forming layer 30 and upper silicon layer 24 as indicated in FIG. 1.

Figure 2:
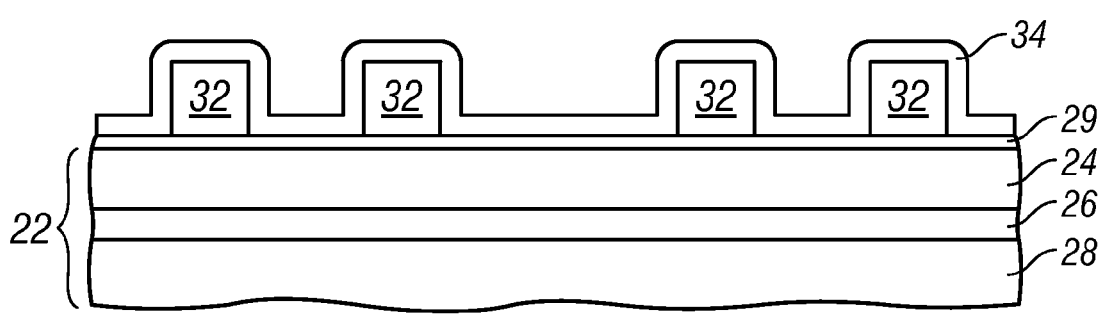

As illustrated in FIG. 2, selected portions of mandrel-forming layer 30 are next removed to create a number of sacrificial mandrels 32 along the upper surface of silicon nitride layer 29 and, more generally, along the upper surface of semiconductor substrate 22. The selected portions of mandrel-forming layer 30 can be removed by first depositing photoresist over mandrel-forming layer 30, patterning the photoresist, etching the portions of mandrel-forming layer 30 exposed through patterned photoresist, and subsequently removing the patterned photoresist. If desired, a plasma etching process can be utilized to remove the portions of mandrel-forming layer 30 exposed through the patterned photoresist or other mask. More specifically, a reactive ion etch process can be performed utilizing a chemistry selective to mandrel-forming layer 30. For example, if mandrel-forming layer 30 is formed from silicon nitride, a trifluoride/oxygen chemistry can be utilized; if mandrel-forming layer 30 is formed from silicon oxynitride or silicon oxide, a carbon hydro-trifluoride or tetrafluoromethane chemistry can be utilized; and if mandrel-forming layer 30 is formed from polycrystalline silicon, a chloride or bromous acid chemistry can be utilized.

After etching mandrel-forming layer 30 to yield sacrificial mandrels 32 in the above-described manner, a spacer-forming layer 34 is deposited over sacrificial mandrels 32 and silicon nitride layer 29 (FIG. 2). Spacer-forming layer 34 is conveniently formed via the blanket deposition of silicon nitride, silicon oxide, or another suitable dielectric material. In a preferred group of embodiments, the composition of spacer-forming layer 34 is chosen to permit sacrificial mandrels 32 to be removed via a subsequent etching process that is selective to mandrel-forming layer 30 over SIT spacer-forming layer 34; e.g., mandrel-forming layer 30 and spacer-forming layer 34 may comprise silicon nitride and silicon oxide, respectively, thereby permitting sacrificial mandrels formed from mandrel-forming layer 30 to be selectively removed utilizing a hot phosphoric acid wet etch. The thickness to which spacer-forming layer 34 is deposited will generally depend upon the desired critical dimensions of the final fin structure; however, as a non-limiting example, spacer-forming layer 34 may be deposited to a thickness of approximately 15 nanometers (nm) to approximately 40 nm.

Figure 3:
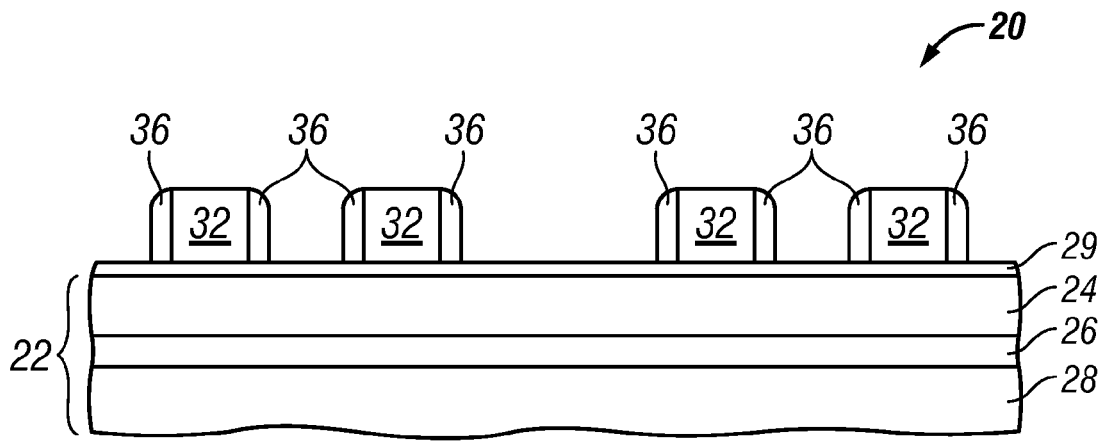
Figure 4:
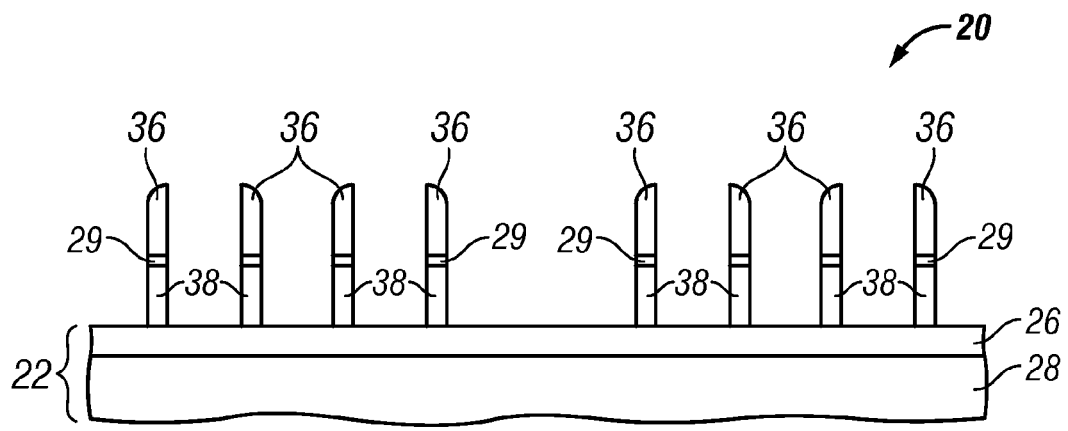

With reference to FIGS. 3 and 4, partially-completed integrated circuit 20 is next subjected to a series of etching steps. As indicated in FIG. 3, an anisotropic or directional etch is first performed to remove selected portions of spacer-forming layer 34 and thereby create sidewall image transfer (SIT) spacers 36 adjacent opposing sides of each sacrificial mandrel 32. Next, as indicated in FIG. 4, a second etching process is performed to selectively remove sacrificial mandrels 32 while leaving intact the bulk of SIT spacers 36; e.g., as previously stated, sacrificial mandrels 32 can be selectively removed utilizing a hot phosphoric acid wet etch in embodiments wherein sacrificial mandrels 32 are formed from a layer of silicon nitride and SIT spacers 36 are formed from a layer of silicon oxide. After removal of sacrificial mandrels 32, one or more additional etching steps are performed to remove the portions of silicon nitride layer 29 and upper silicon layer 24 that are not located beneath SIT spacers 36. These latter etching steps result in the formation of a plurality of fin structures 38 overlying insulating layer 26 of semiconductor substrate 22; in the illustrated portion of exemplary integrated circuit 20, eight such fin structures 38 are formed.

Figure 5:
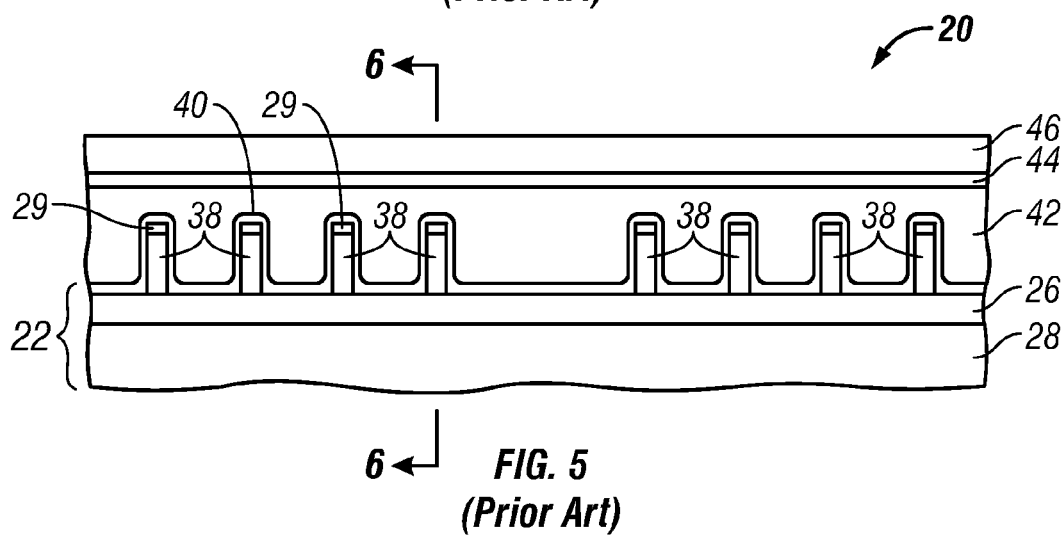

As illustrated in FIG. 5, the exemplary fabrication method continues with the removal of SIT spacers 36 utilizing either a wet or dry etching process. A chemistry selective to SIT spacers 36 is preferably employed during the etching process to minimize erosion of fin structures 38; e.g., if SIT spacers 36 comprise silicon oxide, a carbon hydro-trifluoride or tetrafluoromethane chemistry can be utilized. After removal of SIT spacers 36, a gate insulator layer 40 is formed over fin structures 38 and the upper surface of semiconductor substrate 22. Gate insulator layer 40 can comprise any of the conventional gate-insulating materials for insulating fin structures 38 from the conductive gate electrode layer formed above fin structures 38 as described below. As a first example, gate insulator layer 40 can comprise silicon dioxide ($SiO_2$) thermally grown in an oxidizing ambient. Alternatively, and as a second example, gate insulator layer 40 can comprise a high-k dielectric material deposited over fin structures 38 and the exposed upper surface of semiconductor substrate 22 utilizing a vapor deposition process, such as chemical vapor deposition (CVD), low pressure chemical vapor deposition (LPCVD), or plasma enhanced chemical vapor deposition (PECVD). A non-exhaustive list of high-k dielectric materials that may be deposited to form gate insulator layer 40 includes hafnium dioxide, hafnium silicon oxide, titanium dioxide, tantalum pentoxide, zirconium dioxide, and various other compounds that have a relatively high dielectric constant as compared to silicon dioxide or silicon oxynitride. The thickness of gate insulator layer 40 will vary depending upon the desired performance characteristics of integrated circuit 20; however, it is generally preferred that gate insulator layer 40 is deposited to a thickness less than approximately 10 nm.

With continued reference to FIG. 5, a conductive gate electrode layer 42 is next deposited over gate insulator layer 40 utilizing a conventional deposition technique, such as CVD, LPCVD, or PECVD. A non-exhaustive list of conductive materials suitable for use in the formation of gate electrode layer 42 includes a polycrystalline silicon and various metals and alloys, such as titanium nitride, tantalum nitride, hafnium silicide, and tantalum carbide. After deposition of gate electrode layer 42, one or more mask layers are deposited over gate electrode layer 42. In the exemplary embodiment illustrated in FIG. 5, specifically, a single nitride capping layer 44 is deposited over conductive gate electrode layer 42. Nitride capping layer 44 can comprise silicon nitride deposited over gate electrode layer 42 utilizing a low temperature deposition process, such as PECVD, performed utilizing silane, ammonia, and/or nitrogen in the presence of an argon plasma.

Figure 6:
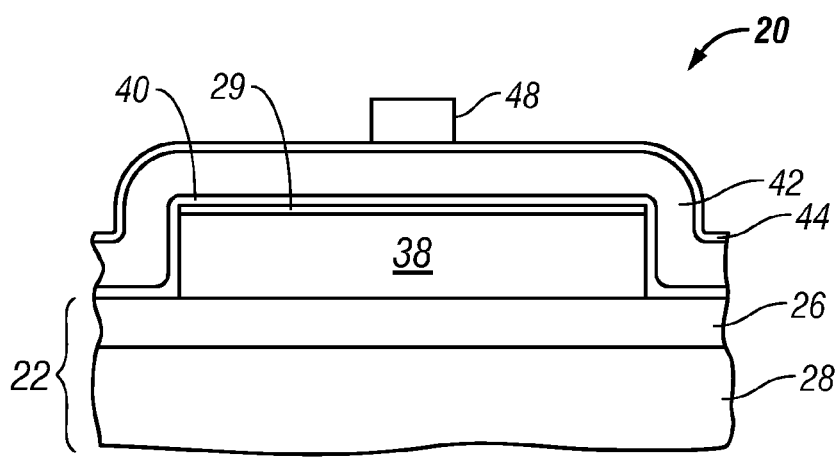
Figure 7:
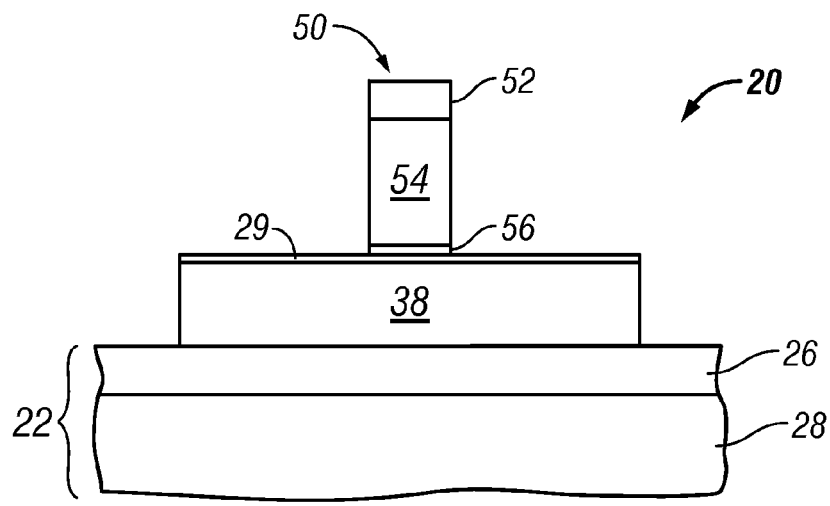

A photoresist layer 46 (FIG. 5) is next deposited over nitride capping layer 44 and patterned utilizing a photolithography process. As indicated in FIG. 6, which is a cross-sectional view of integrated circuit 20 taken along line 6-6 (identified in FIG. 5), photolithography of photoresist layer 46 creates at least one mask structure 48 along the upper surface of nitride capping layer 44. With reference to FIG. 7, one or more etching processes are then performed to define at least one gate stack 50 from the portions of nitride capping layer 44, conductive gate electrode layer 42, and gate insulator layer 40 located beneath mask structures 48. In the illustrated exemplary embodiment, gate stack 50 includes: (i) a nitride cap 52 formed from nitride capping layer 44, (ii) a conductive gate electrode 54 formed from gate electrode layer 42, and (iii) a gate insulator 56 formed from gate insulator layer 40. Mask structure 48 is subsequently removed utilizing a conventional etching process.

Figure 8:
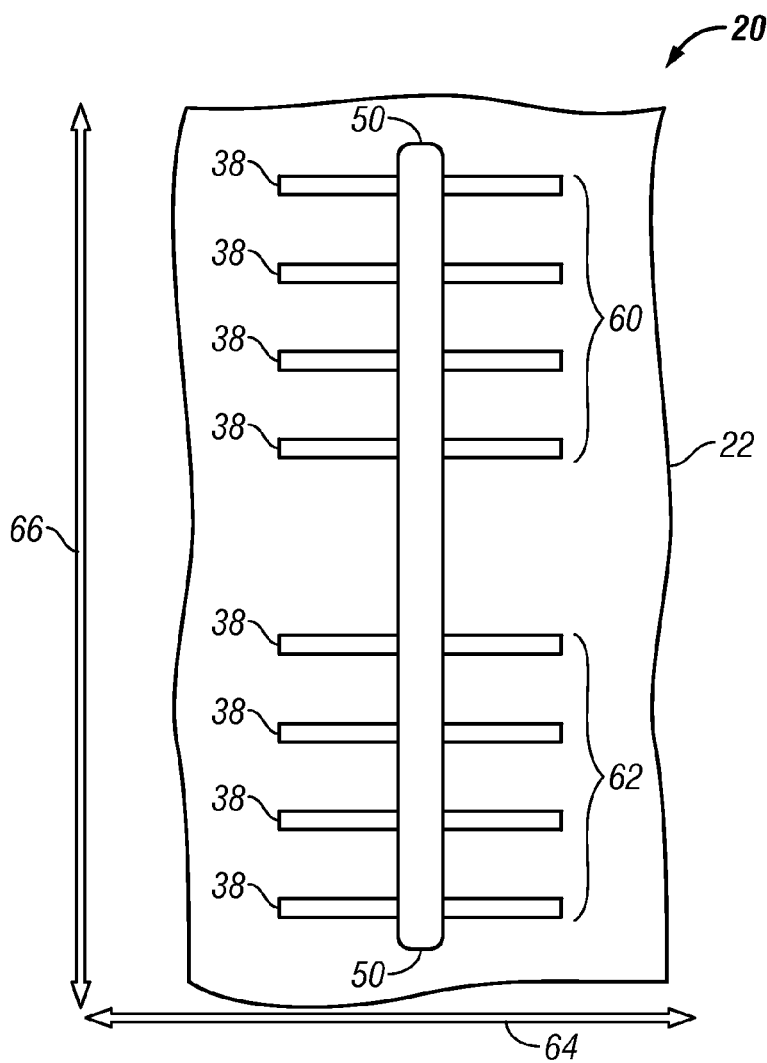

FIG. 8 is a top plan view of partially-completed integrated circuit 20. In this view, it can be seen that partially-completed integrated circuit 20 has been fabricated to include two multi-gate transistors, namely, a first FinFET 60 and a second FinFET 62. In the illustrated example, FinFETs 60 and 62 are fabricated to each include a plurality of fin structures 38, which extend along substrate 22 in a direction generally parallel to a first main axis 64 between common source and drain regions (not shown); of course, in alternative embodiments, FinFETs 60 and 62 can each be fabricated to include a single fin structure. Gate stack 50 overlays and extends across fin structures 38 in a direction generally parallel to a second main axis 66 and generally perpendicular to first main axis 64. Additional steps are performed to complete processing of integrated circuit 20, which are well-known within the industry and are not described herein in the interests of concision. In many cases, the active regions of FinFETs 60 and 62 are electrically interconnected via the formation of a number of back end-of-the-line (BEOL) layers and, specifically, via the formation of a number of metallization layers. The formation of BEOL layers during back end-of-the-line processing provides an effective means for interconnecting multiple semiconductor devices within an integrated circuit; however, as the number and complexity of the BEOL layers increases, so too does the cost and duration of circuit fabrication. Therefore, to help simply and possibly reduce the number BEOL layer required to complete circuit interconnection, the following provides two examples of an integrated circuit that includes a plurality of multi-gate transistors locally interconnected by a one or more continuous fin structures.

FIGS. 9-13 illustrate an integrated circuit 70 (shown in layout format) at various stages of manufacture and produced in accordance with a first exemplary embodiment of the present invention. In this particular example, integrated circuit 70, when completed, assumes the form of particular type of logic circuit, namely, a two input NOR gate. Integrated circuit 70 is presented by way of example only to provide a convenient means for explaining various principles and aspects of the present invention; it will be readily appreciated by one skilled in the relevant field that the following description is equally applicable to a wide variety of alternative circuits, including the second exemplary circuit described below in conjunction with FIGS. 15-20.

Figure 9:
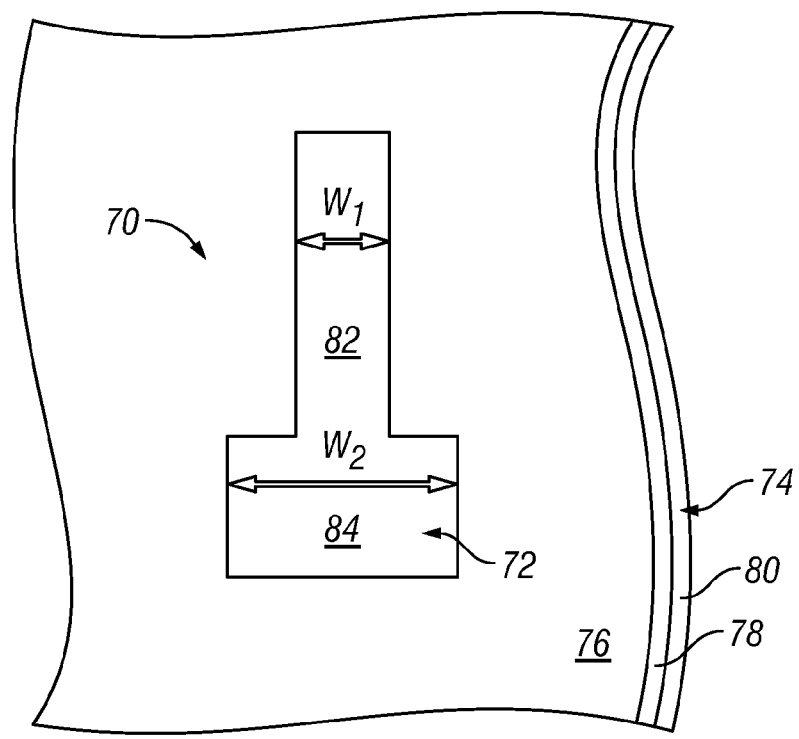
FIGS. 9-13 are top plan views of an integrated circuit including a plurality of interconnected FinFETs at various stages of manufacture and produced in accordance with a first exemplary embodiment.

Referring initially to FIG. 9, a semiconductor substrate 74 is provided. Semiconductor substrate 74 may assume the form any substrate on which integrated circuit 70 can be fabricated, including a bulk silicon substrate. In the exemplary embodiment illustrated in FIG. 9, semiconductor substrate 74 assumes the form of a silicon-on-insulator wafer including an upper silicon layer 76 overlying an intermediate insulating layer 78, which is supported by a silicon carrier wafer 80. A sacrificial mandrel 72 is formed on semiconductor substrate 74. Sacrificial mandrel 72 is conveniently formed in the same manner as were sacrificial mandrels 32 described above in conjunction with FIG. 2. That is, a mandrel-forming layer may first be deposited over semiconductor substrate 74 and subsequently etched utilizing a patterned photoresist to define a sacrificial mandrel having a desired geometry. Although sacrificial mandrel 72 can be formed in a conventionally-known manner, the geometry of sacrificial mandrel 72 is unique; in the exemplary embodiment illustrated in FIG. 9, sacrificial mandrel 72 is formed to have a substantially T-shaped planform geometry. More specifically, sacrificial mandrel 72 is formed to include a first elongated rectangular region 82 having a first width (identified as "$W_1$" in FIG. 9) and a second rectangular region 84 having a second width (identified as "$W_2$" in FIG. 9), which is greater than the first width ($W_1$).

Figure 10:
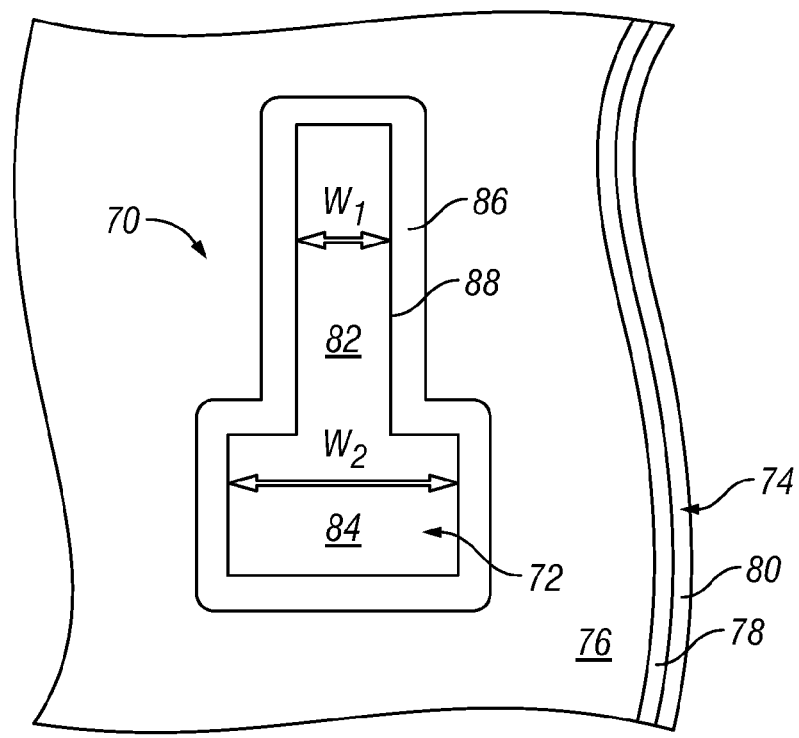

FIG. 10 illustrates integrated circuit 70 after the formation of a sidewall image transfer (SIT) spacer structure 86 circumscribing sacrificial mandrel 72. SIT spacer structure 86 comprises a raised ridge or wall, which has a substantially uniform width and which extends around sacrificial mandrel 72 in a conformal manner. SIT spacer structure 86 consequently has a T-shaped planform geometry including an inner open area 88 having a geometry substantially identical to sacrificial mandrel 72. SIT spacer structure 86 is conveniently formed by first depositing a spacer-forming layer over sacrificial mandrel 72. As noted above in conjunction with FIG. 2, the spacer-forming layer can be formed via the blanket deposition of silicon nitride, silicon oxide, or another suitable dielectric material. After the deposition of the spacer-forming layer, one or more etching steps, such as the anisotropic etching processes described above in conjunction with FIGS. 3 and 4, are performed to yield SIT spacer structure 86 shown in FIG. 10.

Figure 11:
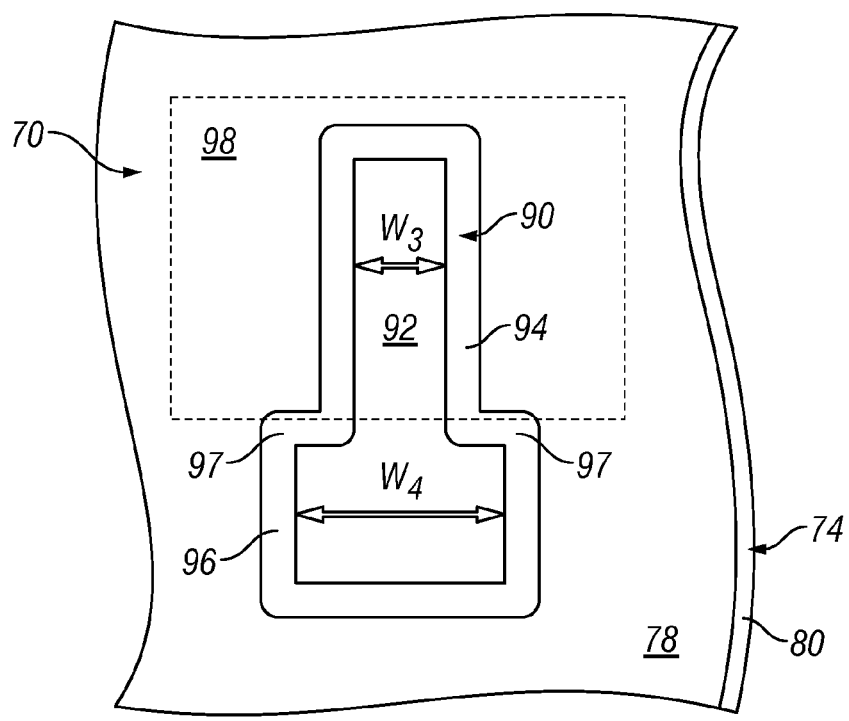

Advancing to FIG. 11, sacrificial mandrel 72 is next removed utilizing, for example, a selective etching process. In embodiments wherein sacrificial mandrel 72 and SIT spacer structure 86 (FIGS. 9 and 10) are formed from silicon nitride and silicon oxide, respectively, sacrificial mandrel 72 is conveniently removed utilizing a hot phosphoric acid wet etch. After removal of sacrificial mandrel 72, the geometry of SIT spacer structure 86 is imparted to semiconductor substrate 74 and, specifically, to upper silicon layer 76 utilizing a sidewall image transfer process. More specifically, the geometry of SIT spacer structure 86 is transferred to upper silicon layer 76 of substrate 74 utilizing one or more etching steps that remove the portions of upper silicon layer 76 not located beneath structure 86 (FIGS. 9 and 10). The etching of upper silicon layer 76 thus results in the formation of a continuous fin structure 90 having a planform geometry substantially identical to the geometry of SIT spacer structure 86, although the height of fin structure 90 and the height of spacer structure 86 may differ. Thus, in the exemplary embodiment illustrated in FIG. 11, continuous fin structure 90 is formed to have a substantially T-shaped inner open area 92, and the outer perimeter portion of fin structure 90 is likewise formed to have a substantially T-shaped geometry. Stated differently, continuous fin structure 90 is formed to include a first generally U-shaped segment 94 having a first inner width (identified as "$W_3$" in FIG. 11) and a second generally U-shaped segment 96 having a second inner width (identified as "$W_4$" in FIG. 11), which is greater than the first inner width ($W_3$). Continuous fin structure 90 further comprises first and second lateral connecting segments 97, which join the arms of U-shaped fin segments 94 and 96 to form a closed loop. This example notwithstanding, continuous fin structure 90 may assume various other shapes and may not form a closed loop in its final form in alternative embodiments. After the formation of continuous fin structure 90, SIT spacer structure 86 (FIGS. 9 and 10) is removed utilizing, for example, a wet or dry etching process selective to SIT spacer structure 86.

It will be appreciated that, at various junctures throughout the manufacturing process, semiconductor substrate 74, continuous fin structure 90, and/or other materials later formed over semiconductor substrate 74 (e.g., silicon grown on fin structure 90 via a selective epitaxial growth process) are impurity doped via ion implantation to create P-wells, N-wells, source regions, drain regions, and various other polarized regions (e.g., source/drain extensions, halo regions, etc.), as appropriate. For example, the region of semiconductor substrate 74 and/or continuous fin structure 90 identified in FIG. 11 by dashed box 98 may be implanted with a first type of ion (e.g., phosphorous) to create an N-well. In the illustrated example wherein semiconductor substrate 74 assumes the form of a silicon-on-insulator wafer, the segment of continuous fin structure 90 within dashed box 98 may be impurity doped after formation of fin structure 90. Additionally or alternatively, the region of upper silicon layer 76 (FIGS. 9 and 10) from which continuous fin structure 90 is ultimately formed may be impurity doped prior to the formation of fin structure 90. In embodiments wherein semiconductor substrate 74 assumes the form of a bulk silicon wafer, the region of continuous fin structure 90 contained within dashed box 98 and/or the region of the bulk silicon wafer underlying fin structure 90 contained within dashed box 98 can be impurity doped to form an N-well. Conversely, the segment of continuous fin structure 90, semiconductor substrate 74, and/or other materials later formed over semiconductor substrate 74 located outside of dashed box 98 can be impurity doped with a second type of ion (e.g., boron) to form a P-well. Although not shown in FIG. 11 for clarity, a gate insulator layer is formed over semiconductor substrate 74 and continuous fin structure 90 after the removal of SIT spacer structure 86. The gate insulator layer can be formed via the deposition or growth of any one of a number of different insulative materials as described above in conjunction with FIG. 5.

Figure 12:
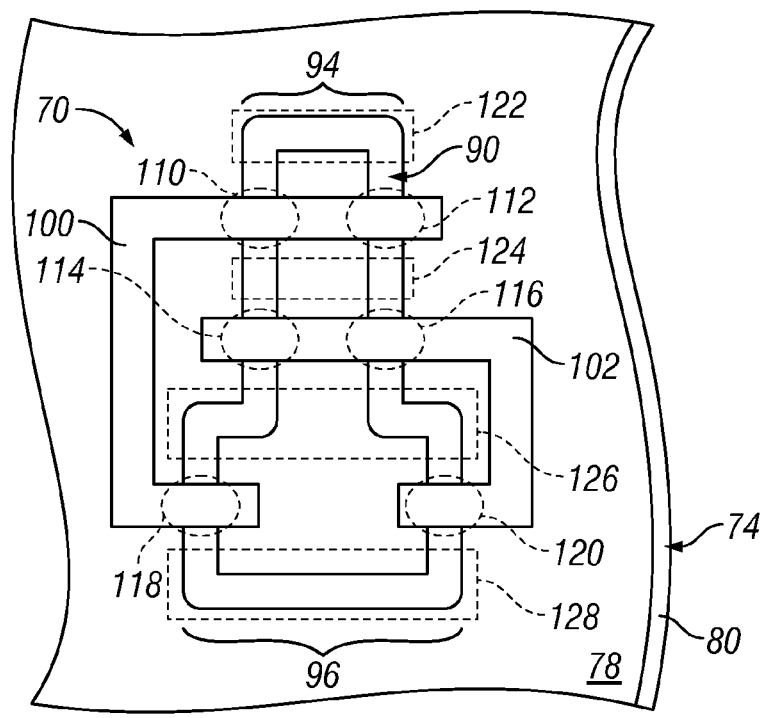

With reference to FIG. 12, two gate structures 100 and 102 are next formed overlying semiconductor substrate 74 and selected regions of continuous fin structure 90. Gate structures 100 and 102 can be formed in substantially the same manner as was conductive gate electrode 54 described above in conjunction with FIG. 6; e.g., gate structures 100 and 102 may be simultaneously formed via the chemical vapor deposition of a conductive gate layer (e.g., polycrystalline silicon, titanium nitride, tantalum nitride, hafnium silicide, tantalum carbide, etc.) and the subsequent patterning of the gate layer utilizing, for example, a photolithography process. If desired, one or more mask layers may also be deposited over the conductive gate electrode layer, such as a silicon nitride or other capping layer. In the illustrated example, gate structures 100 and 102 each include an end portion that extends into, and terminates within, wider portion 96 of continuous fin structure 90.

Gate structures 100 and 102 cooperate with continuous fin structure 90 to form a plurality of multi-gate transistors, with each transistor including a different segment of fin structure 90. In the illustrated example, a total of six multi-gate transistors are formed: (i) four P-Type FinFETs 110, 112, 114, and 116, and (ii) two N-type FinFETs 118 and 120. FinFETs 110, 112, 114, 116, 118, and 120 share a number of common source and drain regions, which are created utilizing well-known ion implantation processes. More specifically, FinFETs 110 and 112 include common source and drain regions 122 and 124, FinFETs 114 and 116 include common source and drain regions 124 and 126, and FinFETs 118 and 120 include common source and drain regions 126 and 128.

Figure 13:
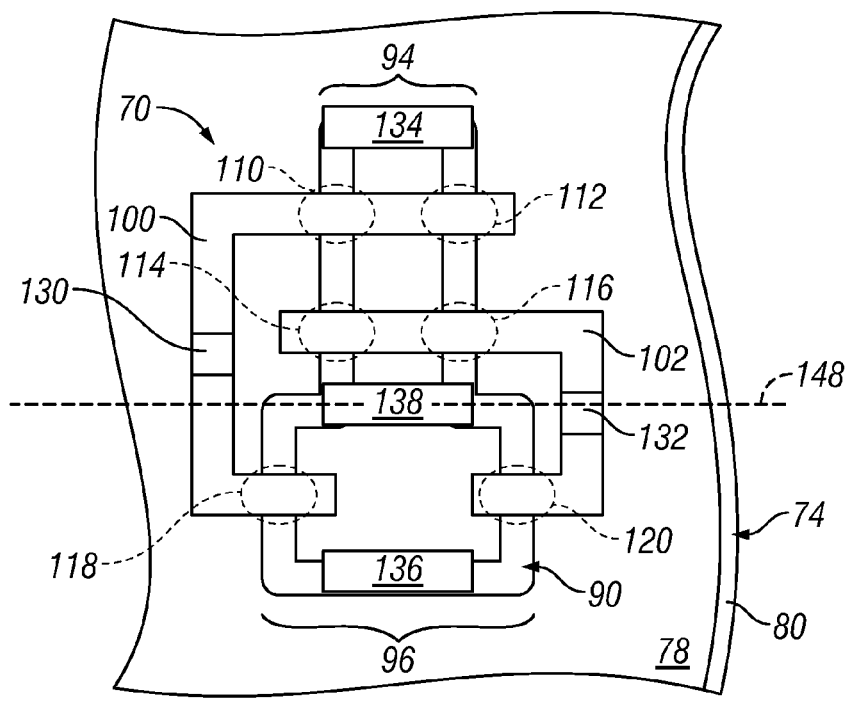

After the formation of gate structures 100 and 102, and after the performance of additional conventionally-know processing steps (e.g., source/drain ion implantation, deposition of interlayer dielectrics, etching to produce vias to the source and drain regions, etc.), contacts are formed to provide electrical connection to the active regions of FinFETs 118 and 120. In the illustrated example wherein integrated circuit 70 assumes the form of a two input NOR gate, and with reference to FIG. 13, five contacts are formed: (i) a positive supply voltage electrode 134 ($V_{DD}$) formed in ohmic contact with a first end portion of continuous fin structure 90 (the upper end portion in the illustrated orientation), (ii) a negative supply voltage electrode 136 ($V_{SS}$) formed in ohmic contact with a second opposing end portion of the continuous fin structure 90 (the lower end portion in the illustrated orientation), (iii) a first input electrode 130 formed in ohmic contact with an intermediate portion of gate structure 100, (iv) a second input electrode 132 formed in ohmic contact with an intermediate portion of gate structure 102, and (v) an output electrode 138 formed in ohmic contact with an intermediate portion of continuous fin structure 90 between positive supply voltage electrode 134 ($V_{DD}$) and negative supply voltage electrode 136 ($V_{SS}$). As indicated in FIG. 13, output electrode 134 is conveniently formed as a bar contact that extends across, and thus electrically couples, the two substantially parallel segments of continuous fin structure 90 that function as the output node of fin structure 90. The foregoing notwithstanding, the placement and dimensions of the contacts included within integrated circuit 70 will inevitably vary amongst different embodiments.

In the exemplary embodiment illustrated in FIG. 12, adjacent FinFETs 118 and 120 are electrically differentiated, while adjacent FinFETs 110 and 112 and adjacent FinFETs 114 and 116 are not. Thus, by forming continuous fin structure 90 to include U-shaped portion 96 having an increased fin-to-fin spacing, a sufficient lateral spacing can be provided between the terminal ends of gate structures 100 and 102 that extend into U-shaped portion 96 to ensure appropriate electrical isolation. At the same time, by forming continuous fin structure to include U-shaped segment 94 having a narrower fin-to-fin spacing, FinFETs 110 and 112 and FinFETs 114 and 116 can be positioned relatively close to one another to reduce the overall dimensions of circuit 70.

FinFETs 118 and 120 are coupled in parallel between output electrode 138 and negative supply voltage electrode 136 ($V_{SS}$). By comparison, FinFETs 110 and 114 and FinFETs 112 and 116 are each coupled in series between positive supply voltage electrode 134 ($V_{DD}$) and output electrode 138. As a result, the resistance between positive supply voltage electrode 134 ($V_{DD}$) and output electrode 138, taken along the segment of continuous fin structure included within FinFETs 110 and 114 or taken along the segment of continuous fin structure included within FinFETs 112 and 116, is considerably higher (e.g., approximately twice) the resistance between output electrode 138 and negative supply voltage electrode 136 ($V_{SS}$). For this reason, the closely-spaced parallel fin segments of continuous fin structure 90 (i.e., the upper portion of continuous fin structure 90 in the illustrated orientation) are preferably electrically merged to decrease the resistance between positive supply voltage electrode 134 ($V_{DD}$) and output electrode 138. Merging of the parallel fin segments of FinFETs 110 and 112 and the parallel fin segments of FinFETs 114 and 116 can be accomplished utilizing a selective epitaxial growth process wherein an epitaxial material, such as silicon or germanium, is grown on the exposed regions of continuous fin structure 90 that are not covered by gate structure 100 or gate structure 102. The epitaxial material merges between parallel segments of continuous fin structure 90 that are separated by a fin-to-fin spacing less than a predetermined minimum spacing thus electrically bridging the closely-spaced fin segments. At the same time, the parallel segments of continuous fin structure 90 separated by a fin-to-fin spacing exceeding the predetermined minimum spacing are not electrically bridged by the epitaxial material and consequently remain electrically differentiated. With respect to the exemplary embodiment shown in FIG. 13, in particular, epitaxial growth results in the electrical merging of the parallel fin segments extending along narrow portion 94 of continuous fin structure 90, while the parallel fin segments extending along wider portion 96 of continuous fin structure 90 remain unmerged.

Figure 14:
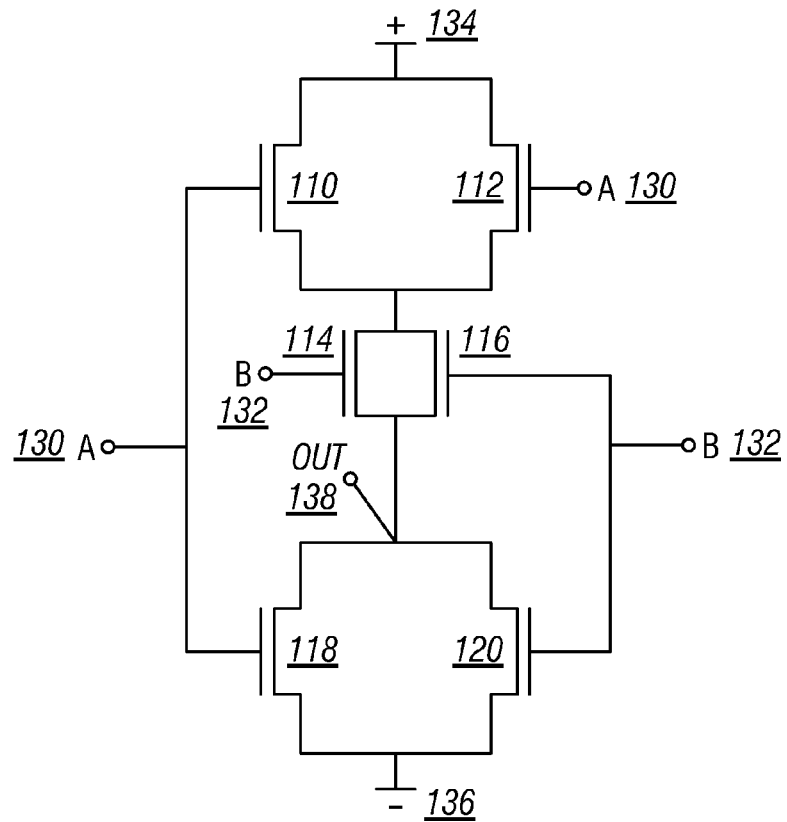
FIG. 14 is a circuit diagram of the first exemplary integrated circuit illustrated in FIGS. 9-13.

FIG. 14 is a circuit diagram of exemplary circuit 70 shown in FIG. 13. Referring collectively to FIGS. 13 and 14, FinFETs 110, 112, and 118 are responsive to the first input signal applied to gate structure 100; and FinFETs 114, 116, and 120 are responsive to the second input signal applied to gate structure 102. As will be appreciated by one of ordinary skill in the art, output electrode 138 will provide a high output (OUT=1) only when the first and second input signals applied to input electrodes 130 and 132, respectively, are both low (A=0, B=0). In all other logical scenarios (A=0, B=1; A=1, B=0; and A=1, B=1), output electrode 138 will provide a low output (OUT=0). The logical operation of exemplary circuit 70 is summarized by Truth Table 1 below.

TRUTH TABLE 1

Two Input NOR Example

| A | B | OUT |
|---|---|-----|
| + | + | −   |
| + | − | −   |
| − | + | −   |
| − | − | +   |

It should thus be appreciated that continuous fin structure 90 locally interconnects each of FinFETs 112, 114, 116, 118, 120, and 122 to collectively form a two input NOR logic gate. Notably, integrated circuit 70 is entirely interconnected by a single continuous fin structure 90 thereby eliminating the need for an $M_1$ metallization layer. In addition, integrated circuit 70 has an extremely compact layout size due, in part, to the unique T-shaped geometry of continuous fin structure 90. This may be more fully appreciated by comparing FIG. 13 to FIG. 15, which is a top plan view of a two input NOR gate layout 150 as commonly implemented utilizing planar transistors, and to FIG. 16, which is top plan view of a two input NOR gate layout 160 as proposed for implementation utilizing non-planar transistors. As can be seen, conventional two input NOR gate planar layout 150 shown in FIG. 15 includes seven contacts (identified at 152 in FIG. 15) and two internal metal connections (identified at 154 in FIG. 15). Similarly, conventional two input NOR gate non-planar layout 160 shown in FIG. 16 includes seven contacts (identified at 162 in FIG. 16) and two internal metal contacts (identified at 164 in FIG. 16). By comparison, integrated circuit 70 (FIG. 13) includes only five contacts (i.e., input electrodes 130 and 132, supply voltage electrodes 134 and 136, and output electrode 138) and no internal metal connections. As a result, integrated circuit 70 has fewer potential failure points and a lower overall capacitance. In addition, integrated circuit 70 requires approximately 33% less area than does conventional two input NOR gate planar layout 150 shown in FIG. 15 or conventional two input NOR gate non-planar layout 160 shown in FIG. 16. As a still further advantage, integrated circuit 70 has improved port flexibility (all five ports in circuit 70 can be placed as desired within the cell width) and better contact yield as compared to conventional two input NOR gate layouts 150 and 160.

Additional characteristics that distinguish exemplary integrated circuit layout 70 (FIG. 13) from conventional planar layout 150 (FIG. 15) and conventional non-planar layout 160 (FIG. 16) include: (i) the $V_{SS}$/ground nodes in layout 70 are electrically coupled by continuous fin structure 90 and, specifically, by U-shaped fin segment 96; (ii) the output nodes of the P-type FinFETs (i.e., FinFETs 110, 112, 114, and 116) and the output nodes of the N-type FinFETs (i.e., FinFETs 118 and 120) are interconnected by straight or bent extensions of continuous fin structure 90; and (iii) continuous fin structure 90, gate structure 100, and gate structure 102 each extend across the boundary separating P-type FinFETs 110, 112, 114, and 116 from the N-type FinFETs 118 and 120 (represented in FIG. 14 by dashed line 148 and corresponding to the lower boundary of well 98 shown in FIG. 11). Furthermore, in layout 70 and other embodiments, the $V_{DD}$ nodes and the $V_{SS}$/ground nodes are grouped within opposing end regions of the circuit layout. For example, and with reference to the orientation illustrated in FIG. 14, the $V_{DD}$ nodes and the $V_{SS}$/ground nodes are grouped within the upper and lower regions of integrated circuit 70, respectively. Finally, it will be noted that the segments of gate structures 102 and 104 included within FinFETs 110, 112, 114, 116, 118, and 120 are formed substantially parallel to the N-FET/P-FET boundary (again, represented in FIG. 14 by dashed line 148), while the segments of continuous fin structure 90 included within FinFETs 110, 112, 114, 116, 118, and 120 are formed substantially perpendicular thereto. Although integrated circuit 70 assumed the form of a two input NOR gate in the foregoing example, it will be appreciated that various other circuits can be implemented wherein a plurality of multi-gate semiconductor devices is interconnected utilizing one or more continuous fin structures. To further emphasize this point, a second exemplary circuit assuming the form of a three input NAND gate will now be described in conjunction with FIGS. 17-22.

FIGS. 17-22 illustrate an integrated circuit 170 (shown in layout format) at various stages of manufacture and produced in accordance with a second exemplary embodiment of the present invention. In many respects, integrated circuit 170 is similar to integrated circuit 70 described above in conjunction with FIGS. 9-14; however, in contrast to integrated circuit 70, integrated circuit 170 assumes the form of three input NAND gate. Integrated circuit 170 can be fabricated utilizing steps similar to those described above in conjunction with integrated circuit 70; thus, the steps utilized to fabricate integrated circuit 170 will be described only briefly or omitted in the following description.

Figure 17:
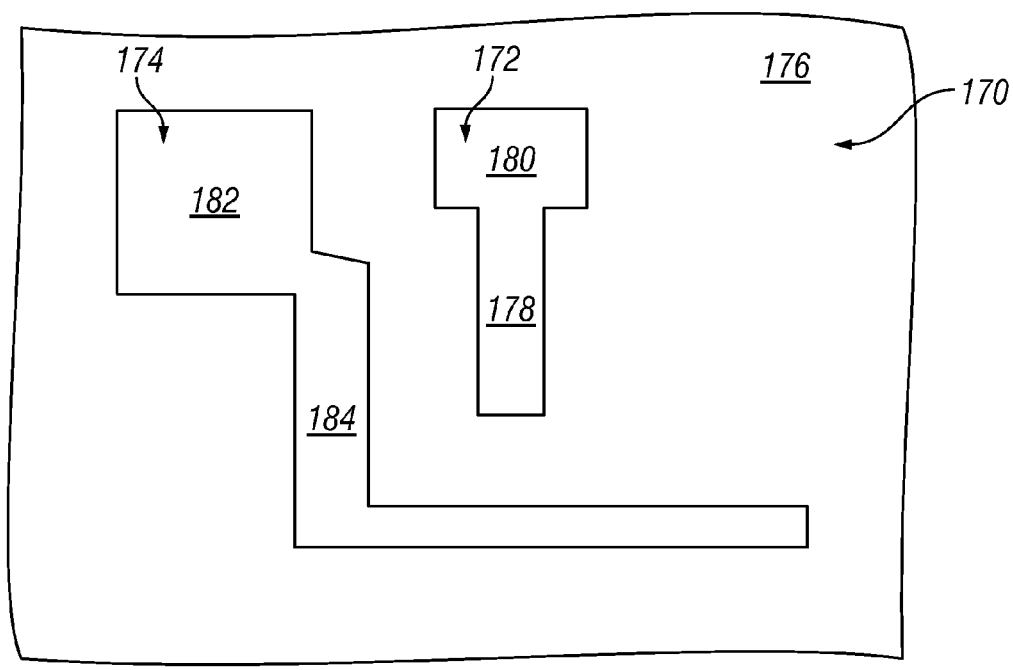
FIGS. 17-22 are top plan views of an integrated circuit including a plurality of interconnected FinFETs at various stages of manufacture and produced in accordance with a second exemplary embodiment.

With initial reference to FIG. 17, two sacrificial mandrels 172 and 174 are formed over a substrate 176 (e.g., a silicon-on-insulator substrate or a bulk silicon wafer). As may be appreciated by comparing FIG. 17 to FIG. 9, sacrificial mandrel 172 is formed to have a substantially T-shaped planform geometry similar to that of sacrificial mandrel 72 (FIG. 9), although the orientation of sacrificial mandrel 172 is rotated approximately 180 degrees relative to mandrel 72 (FIG. 9). Sacrificial mandrel 172 includes a first elongated rectangular region 178 having a first width and a second rectangular region 180 having a second width greater than the first width. Sacrificial mandrel 174 is formed adjacent sacrificial mandrel 172 and includes a generally rectangular body portion 182 and an elongated L-shaped leg portion 184, which extends from body portion 182 to partially circumscribe sacrificial mandrel 172. Sacrificial mandrels 172 and 174 can be formed utilizing the deposition and etching processes described above in conjunction with FIGS. 2 and 9.

Figure 18:
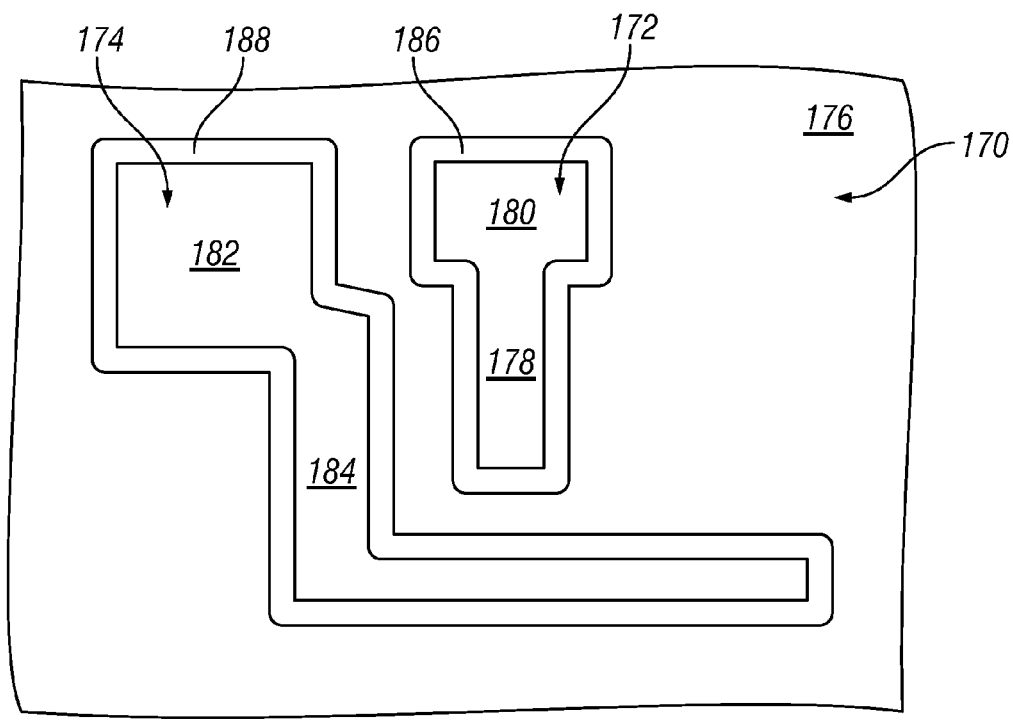
Figure 19:
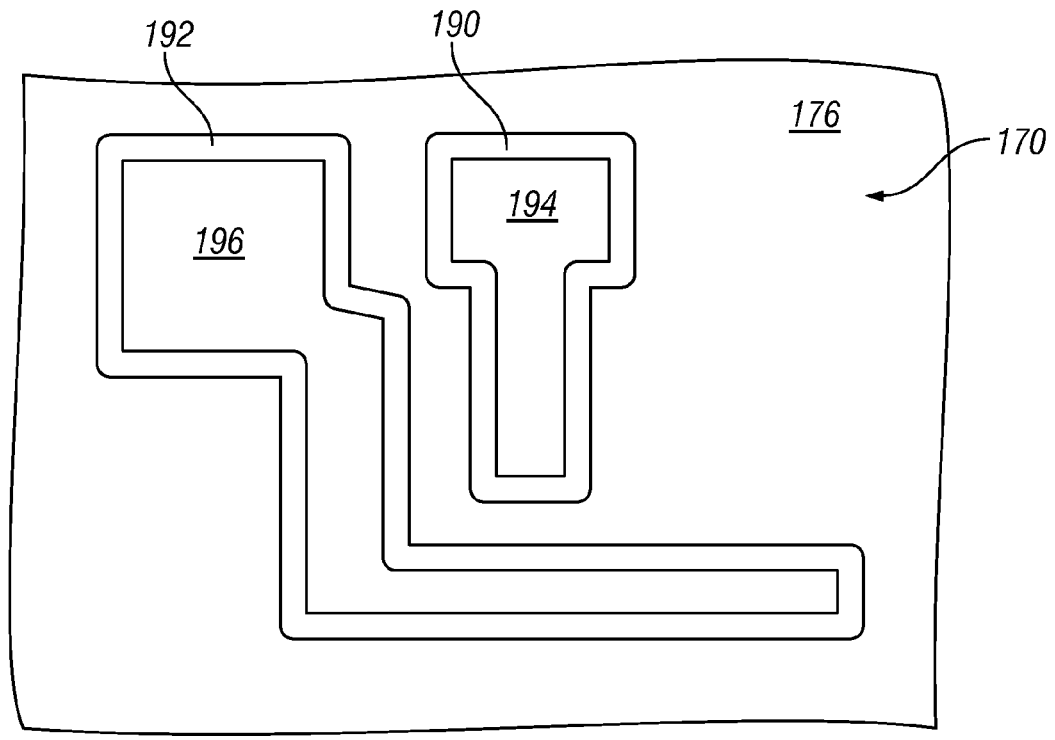

FIG. 18 illustrates integrated circuit 170 after the formation of SIT spacer structures 186 and 188 circumscribing sacrificial mandrels 172 and 174, respectively; and FIG. 19 illustrates integrated circuit 170 after the sidewall image transfer of the geometry of SIT spacer structures 186 and 188 to the upper silicon layer of semiconductor substrate 176 and the subsequent removal of SIT spacer structures 186 and 188. Sidewall image transfer of the SIT spacer structures 186 and 188 (FIG. 18) results in the formation of continuous fin structures 190 and 192, respectively, shown in FIG. 19. Continuous fin structure 190 includes an open inner area 194 having a generally T-shaped planform geometry substantially identical to the geometry of sacrificial mandrel 172 (FIG. 18). Similarly, continuous fin structure 192 includes an inner open area 196 having a generally L-shaped planform geometry substantially identical to that of sacrificial mandrel 172 (FIG. 18). Continuous fin structures 190 and 192 are conveniently formed via the deposition and etching processes described above in conjunction with FIGS. 2-4 and 9. Sacrificial mandrels 172 and 174 (FIG. 18) and SIT spacer structures 186 and 188 (FIG. 18) are preferably removed utilizing a sequence of etching processes, such as the etching sequence described above in conjunction with FIGS. 10 and 11.

With reference to FIG. 19, dashed box 200 demarcates an area of semiconductor substrate 176, continuous fin structure 190, and/or continuous fin structure 192 that can be impurity doped via implantation with a first ion type (e.g., phosphorous) to create an N-well as described above. Conversely, the area of substrate 176, continuous fin structure 190, and/or continuous fin structure 192 located outside of dashed box 200 can be impurity doped via implantation with a second ion type (e.g., boron) to create a P-well. Subsequent to or prior to ion implantation, any functionally unnecessary portions of continuous fin structure 190 and/or continuous fin structure 192 can be removed to decrease the overall size of circuit 170. For example, as indicated in FIG. 19 at 202, a cut mask and an etching process can be utilized to remove an outer segment of continuous fin structure 192 located furthest from continuous fin structure 190. Notably, removal of the outer segment of continuous fin structure 192 in this manner yields terminal ends 203 of structure 192, which provide a convenient means for routing power or signals in a smaller interconnect area than can be directly patterned utilizing conventional techniques.

Figure 21:
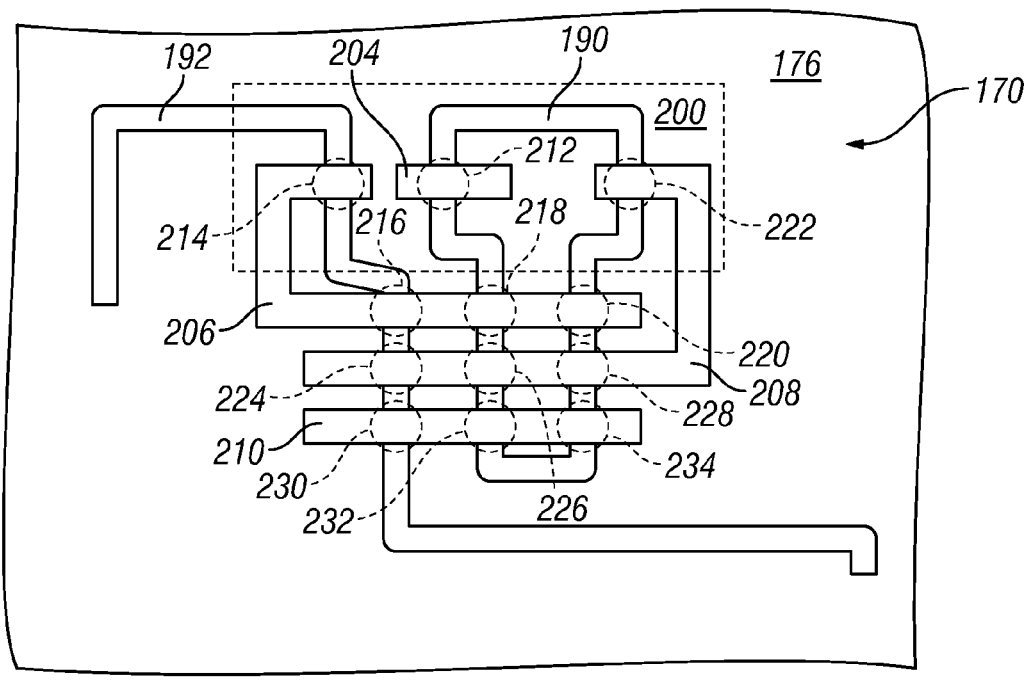

FIG. 21 illustrates integrated circuit 170 after the formation of a number of separate gate structures over selected portions of fin structure 190 and fin structure 192. In this particular example, four gate structures 204, 206, 208, and 210 are formed. As shown in FIG. 21, gate structure 204 overlies an upper segment of continuous fin structure 190; gate structure 206 overlies two segments of continuous fin structure 192 and two segments of continuous fin structure 190; gate structure overlies 208 overlies two segments of continuous fin structure 192 and two segments of continuous fin structure 190; and, finally, gate structure 210 overlies a segment of continuous fin structure 192 and two segments of continuous fin structure 190. Gate structures 204, 206, 208, and 210 can be formed via the patterning of a conductive gate layer deposited over semiconductor substrate 176 in the manner described above in conjunction with FIGS. 6 and 12.

With continued reference to FIG. 21, a FinFET is formed at each location gate structure 204 overlies continuous fin structure 190 or continuous fins structure 192. More specifically, gate structure 204 cooperates with fin structure 190 to form one P-type FinFET 212; gate structure 206 cooperates with fin structures 190 and 192 to form one P-type FinFET 214 and three N-type FinFETs 216, 218, and 220; gate structure 208 cooperates with fin structures 190 and 192 to form one P-type FinFET 222 and three N-type FinFETs 224, 226, and 228; and gate structure 210 cooperates with fin structures 190 and 192 to form three N-type FinFETs 230, 232, and 234. If desired, a selective epitaxial growth process can be performed to electrically merge the closely-spaced parallel segments of continuous fin structure 190 (the lower portion of fin structure 190 in the illustrate example) such that FinFETs 218 and 220, FinFETs 226 and 228, and FinFETs 232 and 234 each function as a double-wide transistor as previously described. Although not shown in FIG. 21 for clarity, FinFETs 214, 216, 218, 220, 222, 224, 226, 228, 230, 232, and 234 include multiple common source and drain regions similar to the source/drain regions described above in conjunction with FIG. 12. Continuous fin structures 190 and 192 each extend across the lower boundary of well 200 separating the P-type FinFETs from the N-type FinFETs included within integrated circuit 170. In addition, the segments of continuous fin structures 190 and 192 included within FinFETs 214, 216, 218, 220, 222, 224, 226, 228, 230, 232, and 234 are each substantially perpendicular to the N-FET/P-FET boundary, while the segments of gate structures 204, 206, 208, and 210 included within FinFETs 214, 216, 218, 220, 222, 224, 226, 228, 230, 232, and 234 are substantially parallel thereto.

Figure 20:
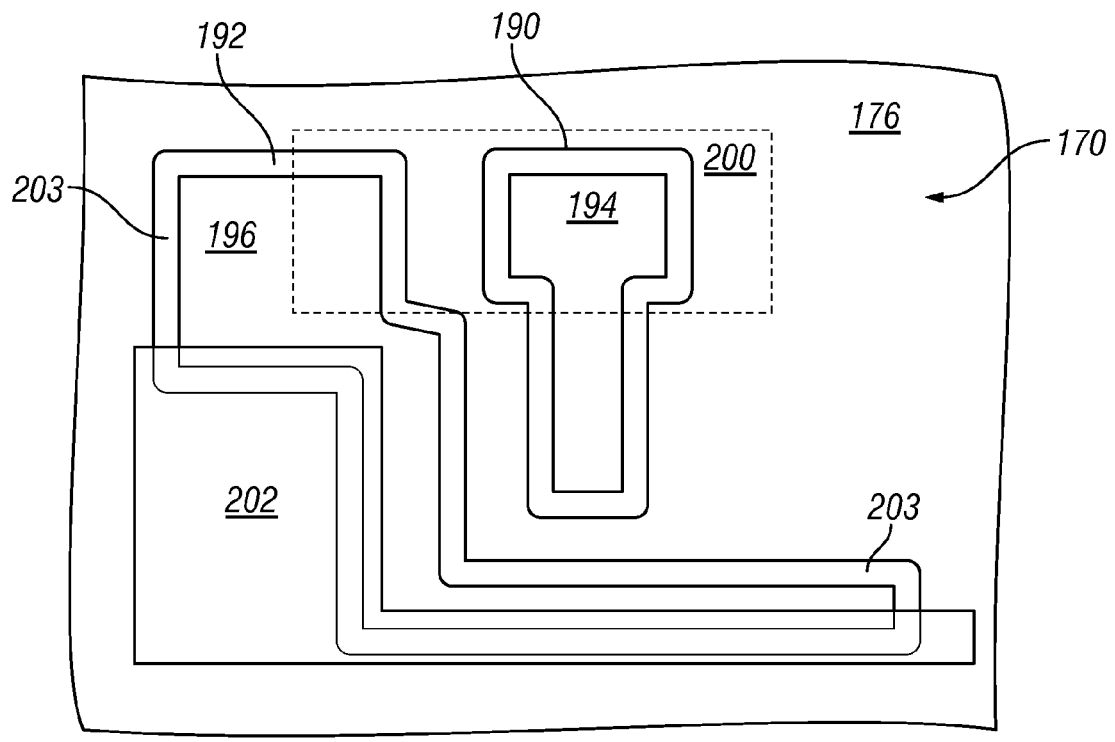

Contacts are next formed, as appropriate, to enable electrical connection to the active regions of integrated circuit 170. As an example, and with reference to FIG. 22, integrated circuit 170 can be formed to include: (i) a positive supply voltage electrode 236 ($V_{DD}$), (ii) a negative supply voltage electrode 238 ($V_{SS}$), (iii) an output electrode 240, and (iv) four input electrodes 242, 244, 246, and 248. As indicated in FIG. 20, electrodes 236, 238, and 240 can be formed as bar electrodes that extend across, and thus electrically couple, multiple substantially parallel segments of continuous fin structure 190 and continuous fin structure 192. Due to the local interconnectivity provided by continuous fin structures 190 and 192, only a single $M_1$ metallization layer (not shown) is required to complete circuit 170 by interconnecting input electrode 242 and input electrode 248. As input electrode 242 and input electrode 248 are electrically coupled by the $M_1$ metallization layer, electrodes 242 and 248 are collectively referred to below as "input electrode pair 242, 248." Notably, positive supply voltage electrode 236 ($V_{DD}$) and negative supply voltage electrode 238 ($V_{SS}$) are located at opposing end regions of integrated circuit 170 (the upper and lower regions of circuit 170 in the illustrated orientation), which enables the complexity and overall area of circuit 170 to be minimized.

Input electrode pair 242, 248, input electrode 244, and input electrode 246 are configured to receive first, second, and third input signals, respectively; and output electrode 240 is configured to produce an output signal as a function of the first, second, and third input signals. FinFETs 212, 230, 232, and 234 are responsive to the first input signal applied to gate structures 204 and 210 via input electrode pair 242, 248; FinFETs 214, 216, 218, and 220 are responsive to the second input signal applied to gate structure 206; and FinFETs 222, 224, 226, and 228 are responsive to the third input signal applied to gate structure 208. Thus, when integrated circuit 170 is fully interconnected, output electrode 240 will provide a low output (OUT=0) only when the input signals applied to input electrodes 244, 246, and 248 are low (A=0, B=0, C=0). In all other logical scenarios, output electrode 240 will provide a high output (OUT=1) as indicated by Truth Table 2 below.

TRUTH TABLE 2

Three Input NAND Example

| A | B | C | OUT |
|---|---|---|-----|
| + | + | + | −   |
| + | + | − | +   |
| + | − | + | +   |
| + | − | − | +   |
| − | + | + | +   |
| − | + | − | +   |
| − | − | + | +   |
| − | − | − | +   |

Figure 22:
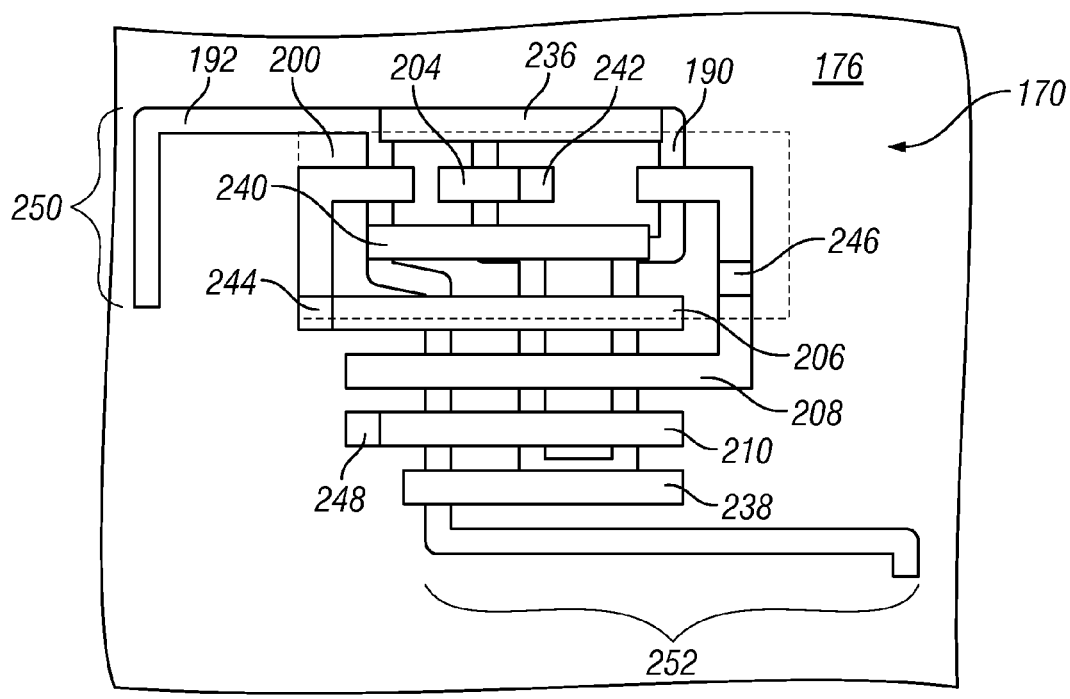
Figure 23:
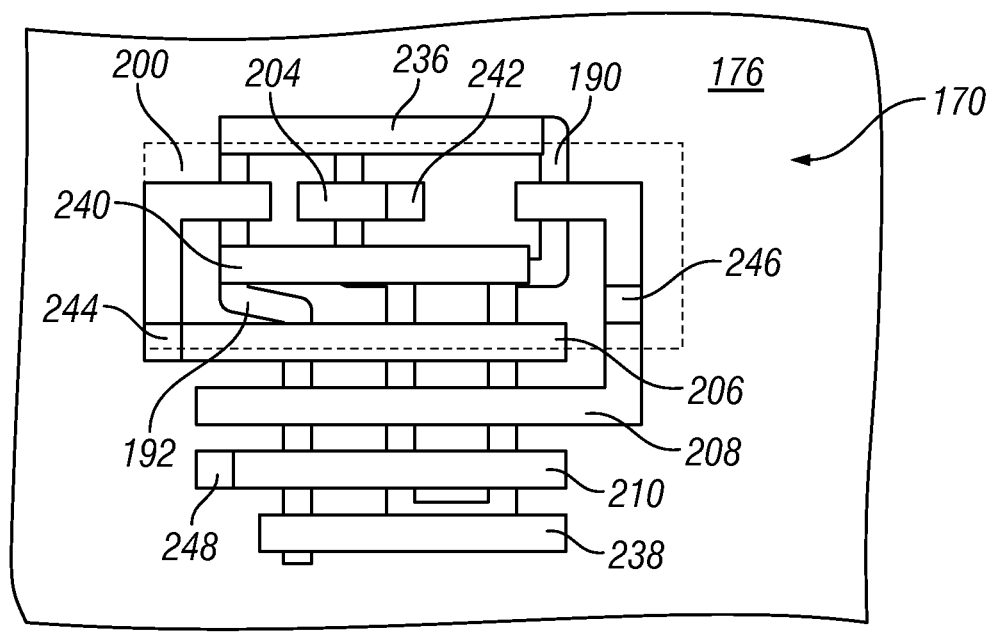
FIG. 23 is a top plan view of an integrated circuit including a plurality of interconnected FinFETs and illustrated in accordance with a third exemplary embodiment.

In the exemplary integrated circuit 170 illustrated in FIG. 22, fin structure 192 includes first and second extensions, which extend outwardly from circuit 170 and which are identified in FIG. 22 by brackets 250 and 252, respectively. As previously indicated, extensions 250 and 252 are conveniently utilized to provide intra cell signal and/or power routing. This notwithstanding, integrated circuit 170 can be formed without fin extensions in alternative embodiments to minimize layout area. To this end, FIG. 23 illustrates an alternative version of integrated circuit 170 wherein circuit 170 does not include either fin extension 250 or fin extension 252; e.g., fin extensions 250 and 252 may be removed during fabrication utilizing an etching process and a suitable cut mask 202, as described above in conjunction with FIG. 19.

The foregoing has thus provided three exemplary integrated circuits including multiple multi-gate semiconductor devices locally interconnected via one or more continuous fin structures. By interconnecting multi-gate semiconductor devices in the above-described manner, the number and complexity of metallization layers formed during back end-of-the-line processing can be significantly reduced. Furthermore, by reducing metal routing requirements, cell size can be reduced, port flexibility can be increased, and wafer cost can ultimately be minimized. In addition, in embodiments wherein the segments of the continuous fin structure or structures included within the non-planar transistors are formed substantially perpendicular to the N-FET/P-FET boundary, and wherein opposing source of supply voltages are disposed at opposing end regions of the cell, the power routing for standard logical cells can often be implemented with a single line of first level metal thus negating the need for further intracell routing, reducing circuit complexity, and minimizing circuit area. Finally, by utilizing one or more continuous fin structures and, in certain embodiments, one or more gate structures to route power and signals in the above-described manner, the number of contacts included within embodiments of the circuit layout can be reduced to decrease the likelihood of open contact failure and improve product yield. While described above in conjunction with two particular types of logic circuits (i.e., a two input NOR gate and a three input NAND gate), and in conjunction with a particular type of multi-gate transistor (i.e., FinFETs), it is emphasized that embodiments integrated circuit can assume various other forms and may include other types of multi-gate semiconductor devices, such as triFETs.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof. Numerical identifiers, such as "first," "second," "third," and the like have been used above in accordance with the order in which elements (e.g., contacts) were introduced during the course of the foregoing Detailed Description. Such numerical identifiers are also used in the subsequent Claims to indicate order of introduction in the Claims. Accordingly, numerical identifiers may vary between the Detailed Description and the subsequent Claims to reflect differences in the order of introduction.

What is claimed is:

1. An integrated circuit, comprising:
   a substrate; and
   a plurality of locally interconnected multi-gate transistors, comprising:
      a continuous fin structure formed on the substrate and comprising an inner open area and an outer perimeter portion, wherein the continuous fin structure has a substantially continuous width across the substrate along the entire length of the continuous fin structure; and
      first and second multi-gate transistors formed on the substrate and including first and second fin segments of the continuous fin structure, respectively, the continuous fin structure electrically interconnecting the first and second multi-gate transistors, wherein the first and second multi-gate transistors comprise spaced-apart first and second gate structures, respectively, overlying the first and second fin segments of the continuous fin structure, wherein the first gate structure is not physically connected to the second gate structure;
      a first input electrode electrically coupled to the first gate structure but not to the second gate structure and a second input electrode electrically coupled to the second gate structure but not to the first gate structure;
      an output electrode electrically coupled to the continuous fin structure;

third and fourth multi-gate transistors formed on the substrate and including third and fourth fin segments of the continuous fin structure, respectively, wherein the third multi-gate transistor comprises a third gate structure overlying the third fin segment of the continuous fin structure, the third gate structure electrically coupled to the first input electrode and responsive to the first input signal, wherein the fourth multi-gate transistor comprises a fourth gate structure overlying the fourth fin segment of the continuous fin structure, the fourth gate structure electrically coupled to the second input electrode and responsive to the second input signal, wherein the continuous fin structure comprises a first lateral connecting segment between the first fin segment and the second fin segment, the first lateral connecting segment generally perpendicular to the first fin segment and to the second fin segment, and wherein the continuous fin structure further comprises a second lateral connecting segment between the third fin segment and the fourth fin segment, the second lateral connecting segment generally perpendicular to the third fin segment and to the fourth fin segment, wherein the first lateral connecting segment has a greater length than the second lateral segment such that the continuous fin structure forms a substantially T-shaped configuration.

2. An integrated circuit according to claim 1 wherein the polarity of the first and second multi-gate transistors is opposite the polarity of the third and fourth multi-gate transistors.

3. An integrated circuit according to claim 1 further comprising:
   a first supply voltage electrode electrically coupled to the continuous fin structure and configured to receive a first source of supply voltage; and
   a second supply voltage electrode electrically coupled to the continuous fin structure and configured to receive a second source of supply voltage less than the first source of supply voltage.

4. An integrated circuit according to claim 3 wherein the first and second multi-gate transistors are electrically coupled in parallel between the second supply voltage electrode and the output electrode.

5. An integrated circuit according to claim 4 wherein the third and fourth multi-gate transistors are electrically coupled in series between the first supply voltage electrode and the output electrode.

6. An integrated circuit according to claim 5 wherein at least the first, second, third, and fourth multi-gate transistors are interconnected by the continuous fin structure to produce a logic circuit.

7. An integrated circuit according to claim 1 further comprising a well formed in the substrate and having a well boundary across which the continuous fin structure extends.

8. An integrated circuit according to claim 7 wherein the plurality of locally interconnected multi-gate transistors includes first and second multi-gate transistors having opposing polarities, the first multi-gate transistor overlying the well and the multi-gate second transistor spaced apart from the well, the continuous fin structure extending from the first multi-gate transistor to the second multi-gate transistor across the well boundary to electrically couple the first and second multi-gate transistors.

9. An integrated circuit according to claim 8 wherein the first and second fin segments are substantially perpendicular to the well boundary, and wherein the segments of the first and second gate structures overlaying the first and second fin segments are substantially parallel to the well boundary.

10. An integrated circuit according to claim 9 wherein the first supply voltage electrode and the second supply voltage electrode are located at opposing end regions of the integrated circuit.

* * * * *